INTEGRATED CIRCUIT PLANAR TRANSISTOR

Filed Nov. 17, 1967

INVENTOR
Andrew G.F. Dingwall

BY W. S. Hill
AGENT 3,510,736

INTEGRATED CIRCUIT PLANAR TRANSISTOR

Andrew G. F. Dingwall, Somerville, N.J., assignor to RCA Corporation, a corporation of Delaware Filed Nov. 17, 1967, Ser. No. 684,020
Int. Cl. H01l *11/00, 15/00*
U.S. Cl. 317—235 5 Claims

ABSTRACT OF THE DISCLOSURE

A transistor of the type which includes a substrate layer of one conductivity type on which is grown an epitaxial layer of opposite conductivity type, a part of which functions as the collector region of the device. Emitter and base regions are diffused into the epitaxial layer. A high conductivity pocket is provided within the substrate beneath the base region such that the area directly beneath the emitter region is left free of diffused impurities.

Figure 1:
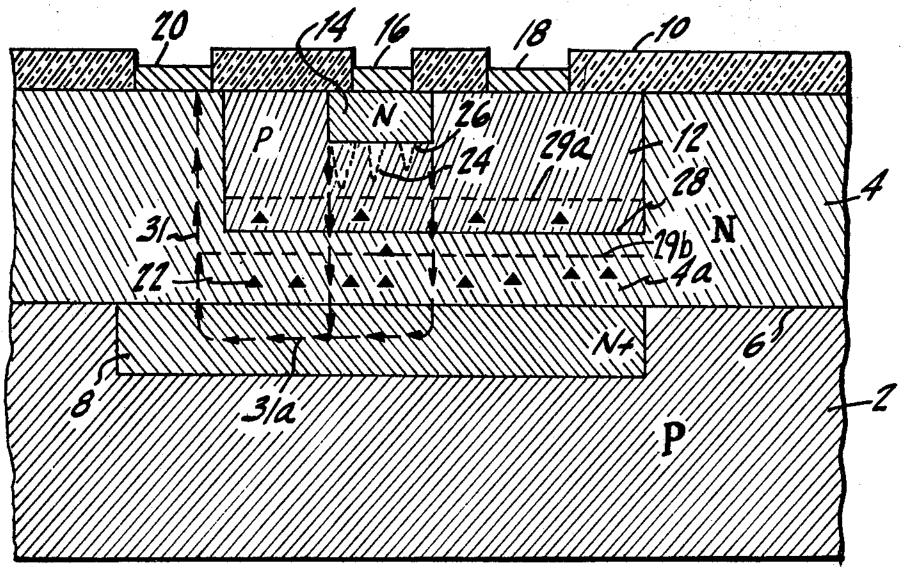
Fig. 1. Prior Art

The invention herein described was made in the course of, or under contract with the Air Force.

BACKGROUND OF THE INVENTION

Integrated circuits of the silicon monolithic type are usually made using a silicon wafer composed of a substrate layer of relatively high resistivity and a relatively high resistivity epitaxial layer grown on the substrate. The epitaxial layer is of conductivity type opposite to that of the substrate layer.

Hundreds of circuits at a time may be fabricated in a single semiconductor wafer, and each circuit may or may not contain one or more bipolar transistors, depending on the type of circuit. If the circuit does include bipolar transistors, each transistor is composed of a collector region, which comprises a portion of the epitaxial layer, and base and emitter regions formed by diffusing appropriate impurities into a portion of the epitaxial layer.

The collector region is usually of relatively high resistivity material in order to have a relatively high base-collector junction breakdown voltage. But this introduces the disadvantage of having a relatively high resistance through the collector region to the collector contact electrode, and this lowers the transistor power gain.

In order to reduce the high collector path resistance, it has previously been proposed to introduce a high conductivity pocket in the substrate layer adjacent the junction between the substrate layer and the epitaxial layer. This high conductivity pocket is positioned adjacent the collector region of the transistor directly below the base, and extends far enough beyond the base region to aid in lowering the resistance in the collector region path to the collector contact. Although the high conductivity pocket has functioned, as expected, to lower the collector resistance, it has introduced other disadvantages which is desirable to eliminate. After the high conductivity pocket is introduced into the substrate layer, subsequently applied high temperatures needed in fabricating the remainder of the transistor cause some of the impurity in the high conductivity pocket to diffuse into the collector region of the transistor and even into the base region, since the distances are relatively short between the collector-to-substrate junction and the base-collector junction. Also, the high doping level of the high-conductivity pocket tends to form crystal imperfections in that part of the substrate. These imperfections are propagated into the epitaxial layer as the layer is grown on the substrate. The imperfections in the collector layer degrade the performance of the transistor. The disadvantages introduced by the diffused impurities and the propagated imperfections will be more specifically explained below.

OBJECT OF THE INVENTION

It is a general object of the present invention to provide an improved planar transistor having a high conductivity pocket in the substrate layer but without at least some of the disadvantages normally present when a high conductivity pocket is present in this type of transistor.

THE DRAWINGS

Figure 2:
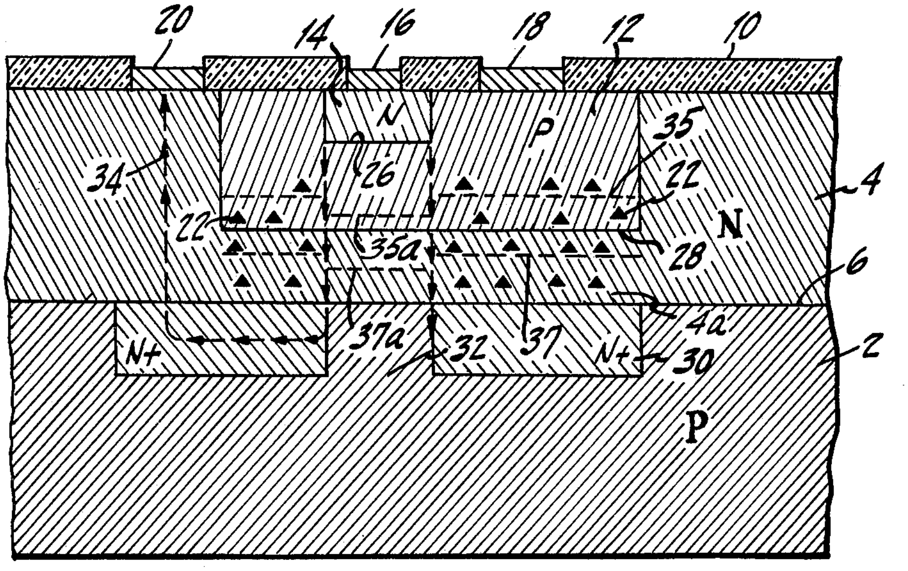

FIG. 1 is a cross-section of a bipolar transistor of a type often included in integrated circuits and constructed according to the prior art, and FIG. 2 is a cross-section of a transistor similar to that of FIG. 1 but with the improved structure of the present invention.

PRIOR ART TRANSISTOR

As illustrated in FIG. 1, a typical prior art transistor that has been used in silicon monolithic integrated circuits includes a P type silicon crystal substrate 2 of relatively high resistivity. The resistivity is not critical but may be on the order of 50 ohm/cm.

On top of the substrate 2 is grown an epitaxial layer 4 composed of N type single crystal silicon. This layer has a relatively high resistivity of 200 to 400 ohms per square. The epitaxial layer 4 is separated from the substrate 2 by a P–N junction 6. Thickness of the epitaxial layer may be, for example, 8 to 10 microns.

A portion of the substrate 2 is occupied by a high conductivity N+ pocket 8 adjacent the junction 6 between the substrate 2 and the epitaxial layer 4. The N+ pocket 8 may be of generally rectangular shape and may be fabricated in the substrate before the epitaxial layer 4 is deposited. This may be done, for example, by temporarily covering the top surface of the substrate 2 with a masking layer, such as a layer of silicon dioxide, deposited by conventional methods, opening up a hole in the silicon dioxide by conventional photomasking and etching techniques and diffusing an N type impurity into the exposed surface of the substrate such as by passing an easily decomposable arsenic compound over the substrate heated to a temperature sufficient to decompose the compound and deposit arsenic on the surface of the substrate. The deposited arsenic is then subsequently diffused into the substrate by heating to the proper temperature for a predetermined length of time.

The transistor is completed by forming base and emitter electrode regions in the epitaxial layer 4 and by applying metal contacts to each electrode. In order to define the various regions where diffusion and metal depositions are to take place, the surface of the epitaxial layer 4 is first covered with a protective layer 10 of silicon dioxide.

A base region 12 of P type conductivity is next formed by diffusing a P type impurity, such as boron, into the epitaxial layer 4 within a space opened in the protective layer 10. The opening in the insulating layer 10 is also formed by conventional photomasking and etching techniques well known in the art.

Similarly to the formation of base region 12, an emitter region 14 may be formed by diffusing an appropriate N type impurity such as arsenic or antimony into the base region. Typically, thickness of the base region may be about 2 microns, and thickness of the emitter region may be about 1.2 microns.

The completed device also includes a metallized emitter contact 16, a base contact 18, and a collector contact 20. These may be made of vapor-deposited aluminum.

Part of the conductivity path for charge carries from the emitter region 14, through the base region 12, and the collector region 4*a* to the collector contact electrode 20, is indicated by the arrows 31. Because of the N+ pocket 8, part of this current path 31*a* is through a region of low resistance instead of through a region of higher resistance in the collector region $4a$. This improves current gain of the device and less heat needs to be dissipated.

The diffusion of the P type impurities forming the base region 12 and of the N type impurities which form the emitter region 14 must be carried out at relatively high temperatures. This causes some of the impurities present in the N+ pocket 8 to diffuse outward in all directions from that pocket. Some of the impurities, therefore, diffuse in an upward direction into that part $4a$ of the epitaxial layer 4 which is directly beneath the base region 12. Some of the impurities diffusing out of the N+ pocket 8 also diffuse upward into the base region 12 and they may approach closely or even touch and enter the emitter region 14.

As previously pointed out, another undesirable effect is the propagation of imperfections from the high conductivity pocket into the collector region $4a$ of the transistor. These imperfections become built into the epitaxial layer 4 as it is grown on the substrate. These imperfections are shown schematically as small triangles 22.

Because of the presence of the imperfections in the epitaxial layer 4 and extending into the base region 12, it is difficult or impossible to obtain a sharp emitter-base junction. When N type impurities are diffused in from the surface of the epitaxial layer 4 to form the emitter region 14, the impurities diffuse more rapidly and therefore diffuse further where there are imperfections than where there are no imperfections. What often happens is that some of the impurities form "spikes" 24 extending downward from the main emitter-base junction 26 varying distances into the base region 12. If these "spikes" extend all the way to the base-collector junction 28 or into the base-collector depletion layer, the boundaries of which the designated by dotted lines $29a$ and $29b$, which is alway formed adjacent the P-N junction, a "short" results and the junction breaks down where the "spike" has penetrated. And since depletion layers tend to expand further into more highly doped regions than into less highly doped regions, the presence of the higher doping in the base region 12, due to diffusion out of the N+ pocket 8, causes the depletion layer to extend closer to the emitter-base junction than it ordinarily would, when the base-collector junction is reverse biased. This effect can considerably lower the breakdown voltage of the base collector junction.

The increased impurity concentration in region $4a$ also increases emitter-collector current.

SUMMARY OF THE PRESENT INVENTION

The present invention comprises an improved bipolar transistor structure in which the high conductivity pocket adjacent the substrate-collector junction has its structure modified so that it is disposed directly beneath the base region, as usual, but not beneath that portion of the base region which is also directly beneath the emitter region. The high conductivity pocket may be of generally annular shape having an opening in the middle which corresponds in lateral cross-section area approximately to the lateral cross-section area of the emitter region.

DESCRIPTION OF THE PREFERRED EMBODIMENT

As shown in FIG. 2, a transistor of the present invention has generally the same parts as the prior art transistor of FIG. 1 except for the modified form of the N+ conductivity pocket in the substrate layer. The transistor may comprise, for example, a substrate layer 2, an epitaxial layer 4, part of which serves as a collector region, a base region 12, and an emitter region 14, all exactly the same as the corresponding regions of the prior art transistor shown in FIG. 1. However, the improved high conductivity pocket in the substrate layer 2 comprises a structure 30 having a centrally-disposed opening 32 directly beneath emitter region 14. The entire inner edge of the pocket is disposed directly below the outer edge of the emitter region 14. The opening 32 and the emitter region 14 have approximately equal lateral cross-section areas. The high conductivity pocket therefore has a generally annular shape but it is intended that this term shall include rectangular as well as circular shapes. Like the prior art transistor of FIG. 1, the present improved transistor also includes an emitter-base junction 26, a base-collector junction 28, an insulating surface protective layer 10, and emitter, base and collector contact electrodes 16, 18 and 20, respectively.

In this improved transistor, illustrated in FIG. 2, imperfections 22 are also formed in the epitaxial layer 4 due to propagation from the high conductivity pocket 30, but, since the portion of the collector region $4a$, which is directly beneath the emitter region 14, has no part of the high conductivity pocket 30 beneath it, impurities from the high conductivity pocket 30 do not diffuse appreciably into this portion of the collector region, and imperfections are not propagated into it. This portion of the epitaxial layer thus remains more perfect.

As a result of the higher perfection in both the collector region and the base region directly beneath the emitter, the diffusion front of the emitter region remains sharp and there is decidedly less tendency for spikes of impurity material to diffuse downward from the diffusion front and penetrate into the base region approaching the base-collector junction. This results in much less tendency to form shorts across the base-collector junction, and, in general, raises the breakdown voltage of the base-collector junction. In addition, charge carrier mobility is improved, which improves high-frequency performance. Emitter-collector leakage is also reduced.

The position of the depletion layer, when the base-collector junction 28 is reverse biased, is also modified. As shown by the dotted lines 35 and 37 which represent the boundaries of the depletion layer in those areas of the base region 12 and collector region $4a$ which are not directly beneath the emitter region 14, the position of that portion of the layer is about the same as in the prior art transistor. But, as shown by the dotted line portions $35a$ and $37a$, the part of the depletion layer directly beneath the emitter region 14 does not penetrate the base region as deeply as in the prior art transistor since this portion of the base region is less highly doped due to absence of diffused impurities from the high conductivity pocket. Punch through voltage is therefore higher.

Transistors which have been constructed in accordance with the teaching of the invention and as illustrated in FIGURE 2 have exhibited the improvements which have been described.

At the same time, the remaining portion of the high conductivity pocket 30 still serves its former function of providing a low conductivity path to the collector contact electrode 20, as indicated by the dotted arrow path 34. It has previously been demonstrated that emission of charge carriers at the emitter-base junction occurs almost entirely at the periphery and almost not at all directly beneath the emitter region. There is thus no need to have high conductivity conducting paths directly beneath the emitter region, provided that the high conductivity path is present in an area directly beneath the periphery of the emitter-base junction and extending out to a position directly beneath the collector contact 20. Transistor beta thus remains at high level.

What is claimed is:

1. A transistor comprising a semiconductor body including:

(a) a substrate region, (b) a layer-like collector region contiguous with said substrate region, (c) a layer-like base region contiguous with and forming a base collector P-N junction with said collector region and spaced from said substrate region, (d) a layer-like emitter region contiguous with and forming an emitter base P-N junction with said base region and spaced from said collector region, said emitter region having a lesser lateral extent than that of said base region whereby said emitter region overlies a portion only of said base region, and (e) a pocket within said substrate region adjacent to said collector region, said pocket being of greater conductivity than the portion of said substrate region adjacent to said pocket and being disposed opposite that portion only of said base region which said emitter region does not overlie and said pocket being shaped such that its entire inner edge is disposed directly below the outer edge of said emitter region.

2. A transistor comprising:

(a) a substrate composed of a layer of lightly-doped semiconductor material of one conductivity type, (b) a collector region comprising an epitaxial layer of semiconductor material of opposite conductivity type on said substrate layer, (c) a base region of said one conductivity type within said epitaxial layer and adjoining said collector region and spaced from said substrate layer, said base and collector regions being separated by a P-N junction, (d) an emitter region of said opposite conductivity type adjoining said base region and of lesser lateral cross-section than said base region, said base region and said emitter region being separated by a P-N junction, and (e) a highly-doped annular-shaped region of said opposite conductivity type within said substrate layer adjoining said collector region, said last-mentioned region being disposed at least partially directly beneath said base region but not substantially beneath said emitter region.

3. A transistor according to claim 2 in which the central opening of said annular-shaped region has a lateral cross-section area approximately equal to that of said emitter region.

4. A transistor according to claim 2 in which said collector region, said base region and said emitter region extend to one surface of said epitaxial layer and each of said three last-mentioned regions has a contact electrode on said surface.

5. A transistor according to claim 4 in which said contact electrode of said collector region lies directly above a portion of said highly-doped region.

References Cited

UNITED STATES PATENTS 3,260,902 7/1966 Porter ------------- 317—235

JOHN W. HUCKERT, Primary Examiner

J. R. SHEWMAKER, Assistant Examiner